(12) United States Patent
Shur et al.

(10) Patent No.: US 10,693,035 B2
(45) Date of Patent: Jun. 23, 2020

(54) OPTOELECTRONIC DEVICE WITH A NANOWIRE SEMICONDUCTOR LAYER

(71) Applicant: Sensor Electronic Technology, Inc., Columbia, SC (US)

(72) Inventors: Michael Shur, Latham, NY (US); Grigory Simin, Columbia, SC (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/331,896

(22) Filed: Oct. 23, 2016

(65) Prior Publication Data

US 2017/0117438 A1 Apr. 27, 2017

Related U.S. Application Data

(60) Provisional application No. 62/245,520, filed on Oct. 23, 2015, provisional application No. 62/382,210, filed on Aug. 31, 2016, provisional application No. 62/245,518, filed on Oct. 23, 2015.

(51) Int. Cl.
*H01L 33/06* (2010.01)
*H01L 33/32* (2010.01)
(Continued)

(52) U.S. Cl.
CPC ............. *H01L 33/06* (2013.01); *G06F 30/30* (2020.01); *H01L 31/02005* (2013.01); *H01L 31/02327* (2013.01); *H01L 31/022466* (2013.01); *H01L 31/03048* (2013.01); *H01L 31/0392* (2013.01); *H01L 31/035227* (2013.01); *H01L 31/035236* (2013.01); *H01L 31/1848* (2013.01); *H01L 31/1852* (2013.01); *H01L 33/007* (2013.01); *H01L 33/08* (2013.01); *H01L 33/12* (2013.01);
(Continued)

(58) Field of Classification Search
CPC .............................. H01L 33/007; H01L 33/06
See application file for complete search history.

(56) References Cited

U.S. PATENT DOCUMENTS 7,407,872 B2   8/2008   Han et al.
9,020,005 B2 *  4/2015   Wright ..................... H01S 5/18
                                                      372/43.01
(Continued)

OTHER PUBLICATIONS

Sarwar, A., et al., "Tunnel Junction Enhanced Nanowire Ultraviolet Light Emitting Diodes," Department of Electrical and Computer Engineering, The Ohio State University, 17 pages.
(Continued)

*Primary Examiner* — Lex H Malsawma
*Assistant Examiner* — Xia L Cross
(74) *Attorney, Agent, or Firm* — LaBatt, LLC

(57) ABSTRACT

A heterostructure for use in an electronic or optoelectronic device is provided. The heterostructure includes one or more semiconductor layers containing columnar nanostructures (e.g., nanowires). The nanowire semiconductor layer can include sub-layers of varying composition, at least one of which is an active layer that can include quantum wells and barriers. A heterostructure can include n-type and p-type semiconductor contact layers adjacent to the nanowire semiconductor layer containing the active layer.

18 Claims, 14 Drawing Sheets

(51) Int. Cl.
| | |
|---|---|
| H01L 33/40 | (2010.01) |
| H01L 33/64 | (2010.01) |
| G06F 30/30 | (2020.01) |
| H01L 31/02 | (2006.01) |
| H01L 31/0224 | (2006.01) |
| H01L 31/0232 | (2014.01) |
| H01L 31/0304 | (2006.01) |
| H01L 31/0352 | (2006.01) |
| H01L 31/0392 | (2006.01) |
| H01L 31/18 | (2006.01) |
| H01L 33/00 | (2010.01) |
| H01L 33/08 | (2010.01) |
| H01L 33/12 | (2010.01) |
| H01L 33/30 | (2010.01) |
| H01L 33/42 | (2010.01) |
| H01L 33/46 | (2010.01) |
| H01L 33/38 | (2010.01) |
| H01S 5/30 | (2006.01) |
| H01S 5/343 | (2006.01) |

(52) U.S. Cl.
CPC .............. *H01L 33/30* (2013.01); *H01L 33/32* (2013.01); *H01L 33/405* (2013.01); *H01L 33/42* (2013.01); *H01L 33/46* (2013.01); *H01L 33/642* (2013.01); *H01L 33/382* (2013.01); *H01L 2933/0091* (2013.01); *H01S 5/3054* (2013.01); *H01S 5/3086* (2013.01); *H01S 5/34333* (2013.01)

(56) References Cited

U.S. PATENT DOCUMENTS

| | | | |
|---|---|---|---|
| 9,331,244 | B2 | 5/2016 | Shatalov et al. |
| 9,425,353 | B2 | 8/2016 | Shur et al. |
| 2007/0246700 | A1* | 10/2007 | Park ........................ H01L 33/22 257/13 |
| 2011/0299074 | A1 | 12/2011 | Kim et al. |
| 2012/0164767 | A1* | 6/2012 | Gasse ................... H01L 27/153 438/27 |
| 2012/0164796 | A1 | 6/2012 | Lowenthal et al. |
| 2012/0205614 | A1* | 8/2012 | Templier ............... H01L 27/156 257/9 |
| 2012/0241718 | A1 | 9/2012 | Chen et al. |
| 2013/0112945 | A1* | 5/2013 | Gilet ........................ H01L 33/06 257/13 |
| 2014/0339587 | A1* | 11/2014 | Kawaguchi ........... H01L 33/405 257/98 |
| 2014/0363912 | A1 | 12/2014 | Ohlsson et al. |
| 2015/0108428 | A1 | 4/2015 | Shatalov et al. |
| 2016/0111595 | A1* | 4/2016 | Lee ........................ H01L 33/06 257/13 |
| 2017/0104135 | A1 | 4/2017 | Shur et al. |
| 2017/0117437 | A1 | 4/2017 | Shur et al. |

OTHER PUBLICATIONS

Su, J., et al., "MOCVD Growth of AlGaN/GaN Heterostructures on 150 mm Silicon," CS MANTECH Conference, 2013, 4 pages.
Zhoo, S., "Aluminum nitride nanowire light emitting diodes: Breaking the fundamental bottleneck of deep ultraviolet light sources," Scientific Reports, Feb. 16, 2015, 5 pages.
Cross, X., U.S. Appl. No. 15/331,895, Office Action1, dated Jan. 26, 2018, 24 pages.
Cross, X., U.S. Appl. No. 15/331,895, Final Office Action, dated Aug. 30, 2018, 18 pages.
Joannopoulos, J., et al.,"Photonic Crystals: Molding the Flow of Light," Princeton University Press, Copyright 2008, 286 pages.
Cross, X., U.S. Appl. No. 15/331,895, Office Action 2, dated Jun. 26, 2019, 18 pages.
Cross, X., U.S. Appl. No. 15/331,896, Final Office Action 2, dated Dec. 30, 2019, 19 pages.

* cited by examiner

1 μm  Mag = 10.00 K X

100nm  Mag = 100.00 K X 40A  40B 40C  40D

Individual nanowire

OPTOELECTRONIC DEVICE WITH A NANOWIRE SEMICONDUCTOR LAYER

REFERENCE TO RELATED APPLICATIONS

The current application claims the benefit of U.S. Provisional Application No. 62/245,518, which was filed on 23 Oct. 2015, U.S. Provisional Application No. 62/245,520, which was filed on 23 Oct. 2015, and U.S. Provisional Application No. 62/382,210, which was filed on 31 Aug. 2016, each of which is hereby incorporated by reference. Aspects of the invention are related to U.S. patent application Ser. No. 15/331,895, filed on 23 Oct. 2016, which is also hereby incorporated by reference.

TECHNICAL FIELD

The disclosure relates generally to optoelectronic group III nitride semiconductor devices containing nanostructures, such as nanowires.

BACKGROUND ART

Nitride semiconductors have received considerable attention for use in the development of light emitting diodes, ultraviolet diodes, photodetectors and high power, high voltage, and high temperature transistors. In the 1990's, two breakthroughs were made in nitride semiconductor growth: the fabrication of high-quality aluminum gallium nitride (AlGaN) films and the realization of p-type GaN. Following these, blue and green light emitting diodes (LEDs) and laser diodes have been commercialized, and ultraviolet (UV) LEDs began to be reported based on AlN.

The AlGaN films are typically grown by industrial scale metallo organic chemical vapor deposition (MOCVD) techniques. To achieve acceptable quality of the films, the growth is performed with a high precursor flow, such as $NH_3$ and TMG (trimethylgallium) or TMA (trimethylaluminium), and hence high partial pressures. A commonly used measure is the so called "V/III ratio" which relates the molar flow of the precursor elements for the group V and group III elements, for example the molar ratio between the $NH_3$ and TMG.

Recently, 1-dimensional nano- and micro-structures that are nanowires fabricated based on nitrides have attracted plenty of attentions from researchers. Several methods, such as VLS, template-confinement growth, and oxide-assisted growth, have been reported for growing AlGaN nanowires. In addition, selective area growth of AlGaN has also been studied extensively to reduce the dislocations density in AlGaN films based on nanowires. These structures offer many benefits for light emitting devices. They allow for reduction of dislocation densities within structures, can lead to devices with improved light extraction efficiency and temperature management.

SUMMARY OF THE INVENTION

Aspects of the invention provide a heterostructure for use in an electronic or optoelectronic device is provided. The heterostructure includes one or more semiconductor layers containing columnar nanostructures (e.g., nanowires). The nanowire semiconductor layer can include sub-layers of varying composition, at least one of which is an active layer that can include quantum wells and barriers. A heterostructure can include n-type and p-type semiconductor contact layers adjacent to the nanowire semiconductor layer containing the active layer.

A first aspect of the invention provides an optoelectronic device comprising: a substrate; a buffer layer located above the substrate; a first n-type semiconductor layer located above the substrate; a nanowire semiconductor layer comprising a plurality of semiconductor nanowires located over the n-type semiconductor layer, wherein each semiconductor nanowire in the plurality of nanowires includes an active region, with the active region including semiconductor quantum wells and barriers; and a first p-type semiconductor layer located above the nanowire semiconductor layer, wherein the nanowire semiconductor layer has a characteristic distance between nanowires approximately twice a smaller of: a diffusion length of electrons in the n-type semiconductor layer or a diffusion length of holes in the p-type semiconductor layer.

A second aspect of the invention provides an optoelectronic device comprising: a substrate; a buffer layer located above the substrate; a first semiconductor layer formed of $Al_{x1}In_{y1}Ga_{1-x1-y1}N$, with molar fractions $0 \leq x1$, $y1$, and $1-x1-y1 \leq 1$ located above the buffer layer, wherein the first semiconductor layer has a first doping type; a nanowire semiconductor layer including a plurality of semiconductor nanowires located over the first semiconductor layer, wherein the plurality of semiconductor nanowires include: a second semiconductor layer formed of $Al_{x2}In_{y2}Ga_{1-x2-y2}N$, with molar fractions $0 \leq x2$, $y2$, and $1-x2-y2 \leq 1$, wherein the second semiconductor layer has the first doping type and is located over the first semiconductor layer; an active region including semiconductor quantum wells and barriers, with the active region located over the second semiconductor layer; and a third semiconductor layer formed of $Al_{x3}In_{y3}Ga_{1-x3-y3}N$, with molar fractions $0 \leq x3$, $y3$, and $1-x3-y3 \leq 1$, located over the active region, with a doping having a second doping type, wherein the second doping type is opposite the first doping type; and wherein the nanowire semiconductor layer has a characteristic distance between nanowires approximately twice a smaller of: a diffusion length of electrons in the first semiconductor layer or a diffusion length of holes in the second semiconductor layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
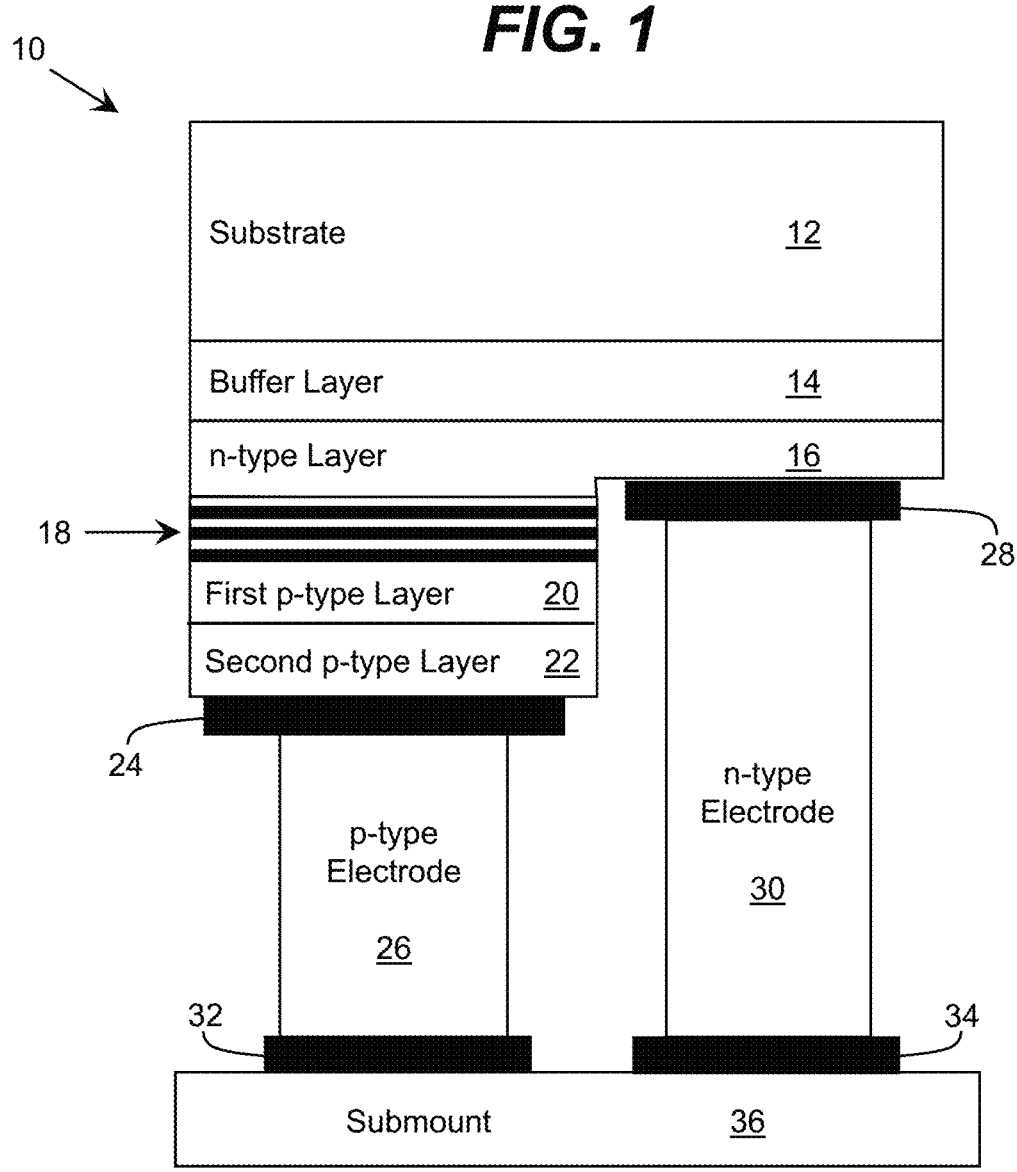
FIG. 1 shows a schematic structure of an illustrative optoelectronic device according to an embodiment.

As indicated above, aspects of the invention provide a heterostructure for use in an electronic or optoelectronic device is provided. The heterostructure includes one or more semiconductor layers containing columnar nanostructures (e.g., nanowires). The nanowire semiconductor layer can include sub-layers of varying composition, at least one of which is an active layer that can include quantum wells and barriers. A heterostructure can include n-type and p-type semiconductor contact layers adjacent to the nanowire semiconductor layer containing the active layer.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/− ten percent of the stated value, while the term "substantially" is inclusive of values within +/− five percent of the stated value. Unless otherwise stated, two values are "similar" when the smaller value is within +/− twenty-five percent of the larger value. A value, y, is on the order of a stated value, x, when the value y satisfies the formula $0.1x \leq y \leq 10x$.

As also used herein, a layer is a transparent layer when the layer allows at least ten percent of radiation having a target wavelength, which is radiated at a normal incidence to an interface of the layer, to pass there through. As used herein, a layer is highly transparent when the layer allows at least fifty percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. As used herein, a layer is a highly reflective layer when the layer reflects at least fifty percent of radiation having a target wavelength, which is radiated at a normal incidence to an interface of the layer. In an embodiment, the target wavelength of the radiation corresponds to a wavelength of radiation emitted or sensed (e.g., peak wavelength +/− five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/− one percent).

Turning to the drawings, FIG. 1 shows a schematic structure of an illustrative optoelectronic device 10 according to an embodiment. In a more particular embodiment, the optoelectronic device 10 is configured to operate as an emitting device, such as a light emitting diode (LED) or a laser diode (LD). In either case, during operation of the optoelectronic device 10, application of a bias comparable to the band gap results in the emission of electromagnetic radiation from an active region 18 of the optoelectronic device 10. The electromagnetic radiation emitted (or sensed) by the optoelectronic device 10 can have a peak wavelength within any range of wavelengths, including visible light, ultraviolet radiation, deep ultraviolet radiation, infrared light, and/or the like. In an embodiment, the device 10 is configured to emit (or sense) radiation having a dominant wavelength within the ultraviolet range of wavelengths. In a more specific embodiment, the dominant wavelength is within a range of wavelengths between approximately 210 and approximately 360 nanometers.

The optoelectronic device 10 includes a heterostructure comprising a substrate 12, a buffer layer 14 adjacent to the substrate 12, an n-type layer 16 (e.g., a cladding layer, electron supply layer, contact layer, and/or the like) adjacent to the buffer layer 14, and an active region 18 having an n-type side adjacent to the n-type layer 16. Furthermore, the heterostructure of the optoelectronic device 10 includes a first p-type layer 20 (e.g., an electron blocking layer, a cladding layer, hole supply layer, and/or the like) adjacent to a p-type side of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, the n-type layer 16, the first p-type layer 20, and the second p-type layer 22 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, 20, and 22. When the optoelectronic device 10 is configured to be operated in a flip chip configuration, such as shown in FIG. 1, the substrate 12 and buffer layer 14 can be transparent to the target electromagnetic radiation. To this extent, an embodiment of the substrate 12 is formed of sapphire, and the buffer layer 14 can be composed of AlN, an AlGaN/AlN superlattice, and/or the like. However, it is understood that the substrate 12 can be formed of any suitable material including, for example, silicon carbide (SiC), silicon (Si), bulk GaN, bulk AlN, bulk or a film of AlGaN, bulk or a film of BN, AlON, $LiGaO_2$, $LiAlO_2$, aluminum oxinitride ($AlO_xN_y$), $MgAl_2O_4$, GaAs, Ge, or another suitable material. Furthermore, a surface of the substrate 12 can be substantially flat or patterned using any solution.

The optoelectronic device 10 can further include a p-type contact 24, which can form an ohmic contact to the second p-type layer 22, and a p-type electrode 26 can be attached to the p-type contact 24. Similarly, the optoelectronic device 10 can include an n-type contact 28, which can form an ohmic contact to the n-type layer 16, and an n-type electrode 30 can be attached to the n-type contact 28. The p-type contact 24 and the n-type contact 28 can form ohmic contacts to the corresponding layers 22, 16, respectively.

In an embodiment, the p-type contact 24 and the n-type contact 28 each comprise several conductive and reflective metal layers, while the n-type electrode 30 and the p-type electrode 26 each comprise highly conductive metal. In an embodiment, the second p-type layer 22 and/or the p-type electrode 26 can be transparent to the electromagnetic radiation generated by the active region 18. For example, the second p-type layer 22 and/or the p-type electrode 26 can comprise a short period superlattice lattice structure, such as an at least partially transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type layer 16 and/or the n-type electrode 30 can be formed of a short period superlattice, such as an AlGaN SPSL, which is transparent to the electromagnetic radiation generated by the active region 18.

As further shown, the optoelectronic device 10 can be mounted to a submount 36 via the electrodes 26, 30 in a flip chip configuration. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

Figure 2A:
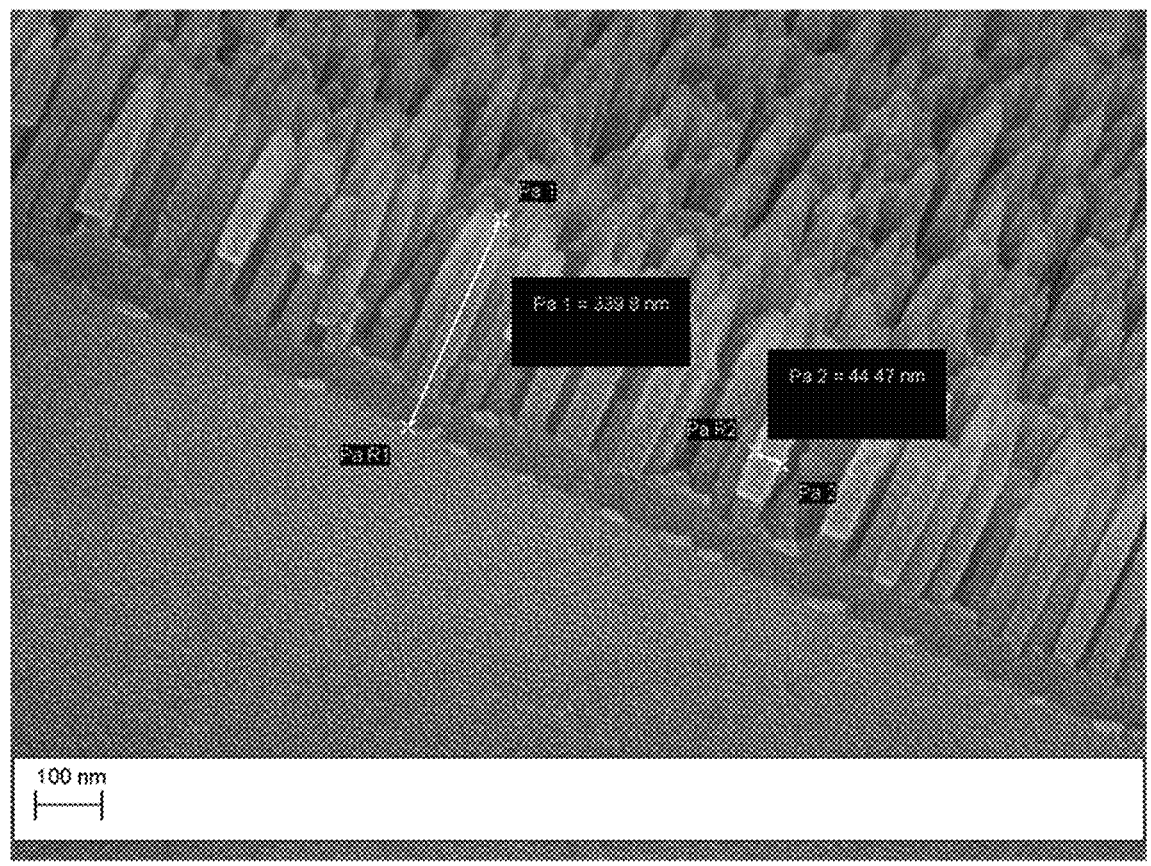
FIGS. 2A-2C show epitaxially grown semiconductor nanowires according to an embodiment.
Figure 2C:
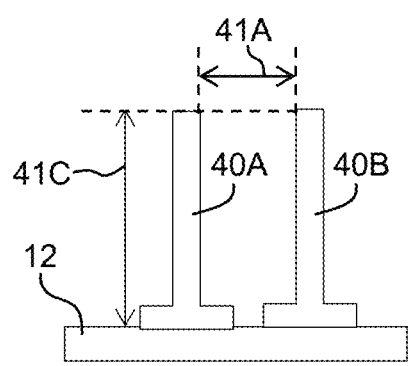
Figure 2B:
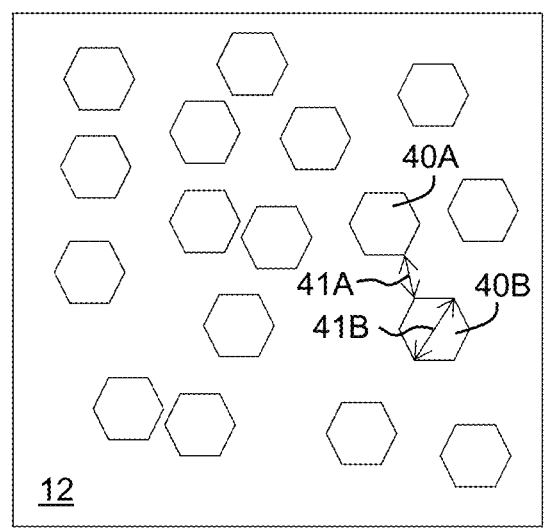

As described herein, the optoelectronic device 10 can include one or more layers formed of a plurality of nanowires. To this extent, FIGS. 2A-2C illustrate aluminum nitride semiconductor nanowires as described in the patent application Ser. No. 14/519,230, filed on 21 Oct. 2014, and which is hereby incorporated by reference. In this case, the aluminum nitride semiconductor nanowires 40A, 40B can be grown from nucleation semiconductor islands using a two-dimensional growth solution (e.g., a high temperature, low V/III ratio). For example, during this period, the growth temperature can be increased to a range of 1100-1400 C and/or a V/III ratio can be in a range of 500-2000. While FIG. 2A shows aluminum nitride semiconductor nanowires, a similar approach can be used to fabricate $Al_xGa_{1-x}N$ semiconductor nanowires, and in general, $Al_xIn_yGa_{1-x-y}N$ semiconductor nanowires. As illustrated in FIGS. 2B and 2C, an embodiment of the columnar structures 40A, 40B can exhibit a high ratio (e.g., greater than five or greater than ten in a more specific embodiment) of characteristic length 41C versus characteristic diameter 41B. In a more particular embodiment, the characteristic spacing 41A for the columnar structures 41A, 41B is in a range of two to one hundred nanometers, the characteristic diameter 41B for the columnar structures 40A-40B is in a range of ten to five hundred nanometers, and the characteristic length 41C is in a range of fifty nanometers to five microns.

Figure 3A:
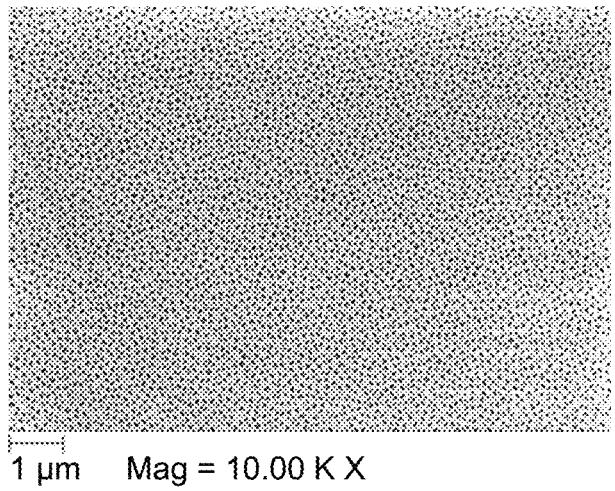
FIGS. 3A and 3B show an illustrative nanowire structure formed using an AAO mask according to an embodiment.
Figure 3B:
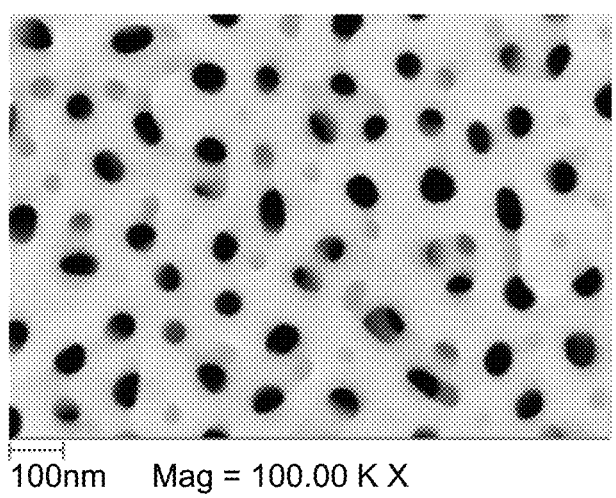

FIGS. 3A and 3B show that an anodized aluminum oxide (AAO) layer can be used as a mask for fabrication of group III nitride semiconductor nanowires, where such an approach was described in the U.S. Pat. No. 9,425,353, which was filed on 2 Oct. 2014, and which is hereby incorporated by reference. Using the AAO mask, the group III nitride semiconductor nanowires can be grown without necessary altering the process used for epitaxial growth of the semiconductor nanowires. Alternatively, the mask can be fabricated through photolithographic process, with periodicity that can be achieved, for example, by means of interference lithography, as known in art, resulting in patterning having desired symmetries. For example, an array of features having hexagonal, rectangular, and/or the like, symmetry can be generated.

Figure 4A:
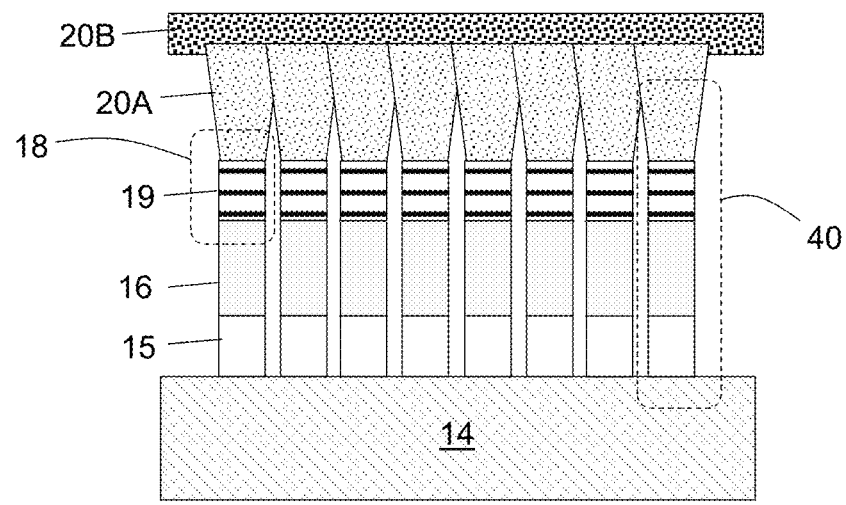
FIGS. 4A and 4B show use of an illustrative AAO mask according to an embodiment.

FIG. 4A illustrates an embodiment of a heterostructure where the semiconductor nanowires 40 are grown over a semiconductor buffer layer 14. The buffer layer 14 can comprise an AlN layer or more generally, a group III nitride semiconductor heterostructure. In particular, the buffer layer structure can be selected to reduce the number of dislocations present at the interface of the buffer layer 14 and the substrate used for epitaxial growth. For example, the buffer layer 14 can comprise various sublayers designed to reduce or redirect the dislocations within the buffer layer 14. Such sublayers can include compositional superlattices, tensile and compressive layers resulting from variations in V/III ratio, semiconductor sublayers containing pores, semiconductor layers comprising nanowires, and/or the like.

In an alternative embodiment, the semiconductor nanowires 40 can be epitaxially grown on another layer in the heterostructure for an optoelectronic device, such as an n-type or p-type group III nitride semiconductor layer. In this case, the semiconductor layer can be grown over an appropriate group III nitride semiconductor buffer layer 14. Various substrates 12 (FIG. 1) can be employed for epitaxial growth. For example, for semiconductor heterostructures used in optoelectronic devices that require high transparency, especially in the ultraviolet range, the substrate 12 can comprise sapphire, bulk AlN and/or the like. However, light absorbing substrates, such as GaN, SiC, and Si, also can be used, e.g., when the substrate is removed as part of the device fabrication and/or when the light does not pass through the substrate during operation of the device.

Semiconductor nanowires 40 can comprise an active layer, or active region, comprising semiconductor quantum wells and barriers. For example, FIG. 4A shows an active region 18 that comprises quantum wells 19 separated by quantum barriers. In general, quantum wells 19 are the semiconductor layers having a semiconductor bandgap that is smaller than the bandgap of the barriers alternating therewith. For example, the quantum wells 19 can comprise semiconductor layers of $Al_xGa_{1-x}N$ having a molar fraction x in the range of 0.2-0.6 with quantum barriers being $Al_yGa_{1-y}N$ with a molar fraction y in the range of 0.4-0.8. The thicknesses of quantum wells 19 are typically in the range of few nanometers and a thickness of the quantum barrier is in the range of few nanometers to few tens of nanometers.

In an embodiment, at least some portion of the semiconductor nanowires 40 have a changing diameter with a minimum-to-maximum diameter ratio of 5 to 50 percent. As shown in FIG. 4A, the semiconductor nanowires can further comprise an n-type region 16 (for cases when epitaxially grown over an n-type semiconductor layer or over a buffer layer), a stress relieving layer 15, and a coalescence layer 20A which can, for example, comprise a p-type semiconductor layer. The nanowires 40 are grown until the complete coalescence as shown by layer 20B. Similar to approaches used to reduce stress and dislocations within the buffer layer, the stress relieving layer 15 can comprise a complex heterostructure. For example, the stress relieving layer 15 can comprise compositional superlattices, tensile and compressive layers resulting from variations in V/III ratio, semiconductor sublayers containing pores, semiconductor inter-layers, and/or the like.

In general, a characteristic radius of a nanowire 40 can be selected based on the fabrication approach, as well as design requirements for the semiconductor heterostructure and resulting optoelectronic device. In an embodiment, the characteristic radius of the nanowires 40 can be defined as a square root of a cross sectional area of the nanowire 40 divided by $\pi$ averaged over multiple nanowires. The characteristic size or diameter of the nanowires 40 can be defined to be twice the characteristic radius. Furthermore, the nanowires 40 can be fabricated with a characteristic separation distance being approximately twice the smaller of: the diffusion length of electrons in the n-type semiconductor layer 16 or the diffusion length of holes in the p-type semiconductor layer 20A.

The diffusion length within a semiconductor layer can be evaluated knowing mobility of the carriers $\mu$ in that layer, temperature T, and a lifetime $\tau$ as: $L=\sqrt{\mu(kT/q)\times\tau}$. Typically, due to a lower mobility of holes, the diffusion length of holes $L_p$ within the p-type layer 20A is smaller than the diffusion length of electrons $L_n$ within n-type layer 16, and $L_p$ is chosen as a characteristic separation distance between the nanowires 40. However, in some cases, when $L_n<L_p$, $L_n$ can be chosen as a characteristic separation distance between nanowires. It is understood that the characteristic distance corresponds to an average distance between the nanowires and can be defined as a distance between closest neighboring nanowire centers minus the characteristic diameter of a nanowire averaged over all the closest neighboring nanowire centers.

Figure 4B:
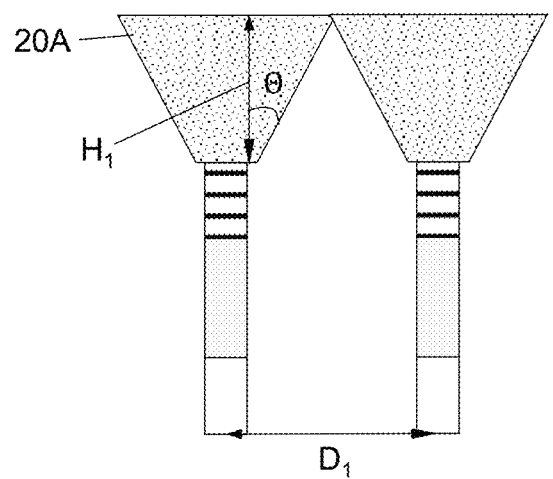

As shown in FIG. 4B, the thickness of the layer 20A, $H_1$ can be related to the distance between the nanowires $D_1$ due to a coalescence angle $\theta$, which can be caculated as: $\tan(\theta)=D_1/2H_1$. In an embodiment, the distance between the nanowires $D_1$ is selected to be approximately twice the smaller of: the diffusion length of electrons in n-type semiconductor layer or the diffusion length of holes in p-type semiconductor layer, which determines $H_1$ for each angle $\theta$. It is understood that the angle $\theta$ is controlled by a particular epitaxial growth process. For example, the angle $\theta$ can be determined by temperature, V/III ratio, and the aluminum nitride molar ratio when epitaxially growing group III nitride semiconductor layers.

In an embodiment, the layer 20A comprises $Al_xIn_yGa_{1-x-y}N$ with molar fractions $0\leq x$, $y\leq 1$, $0\leq 1-x-y\leq 1$. In a more particular embodiment, the layer 20A comprises a p-type contact layer formed by epitaxial lateral overgrowth with the composition of the p-type layer having a gallium nitride molar fraction of at least 0.2. In an embodiment, the p-type layer 20B can comprise gallium nitride or a gallium nitride composition of at least 0.5. In an alternative embodiment, both layers 20A, 20B can comprise a p-type $Al_{x1}In_{y1}Ga_{1-x1-y1}N/Al_{x2}In_{y2}Ga_{1-x2-y2}N$ short period superlattice (SPSL). In an embodiment, prior to deposition of the p-type contact layer, an electron blocking layer can be deposited, which can comprise an $Al_xGa_{1-x}N$ layer with a high aluminum nitride content. In an embodiment, the aluminum nitride molar fraction x can comprise at least 0.6 and in a more particular embodiment can range between 0.7-0.9.

It is further understood that one or more of the semiconductor layers included in the nanowires 40 can have a graded composition. In an embodiment, an electron blocking layer can comprise a graded composition and can include variations in aluminum nitride molar ratio x from the values of 0.4-0.5 to values of 0.6-0.9 and then to values of 0.2-0.

Figure 5:
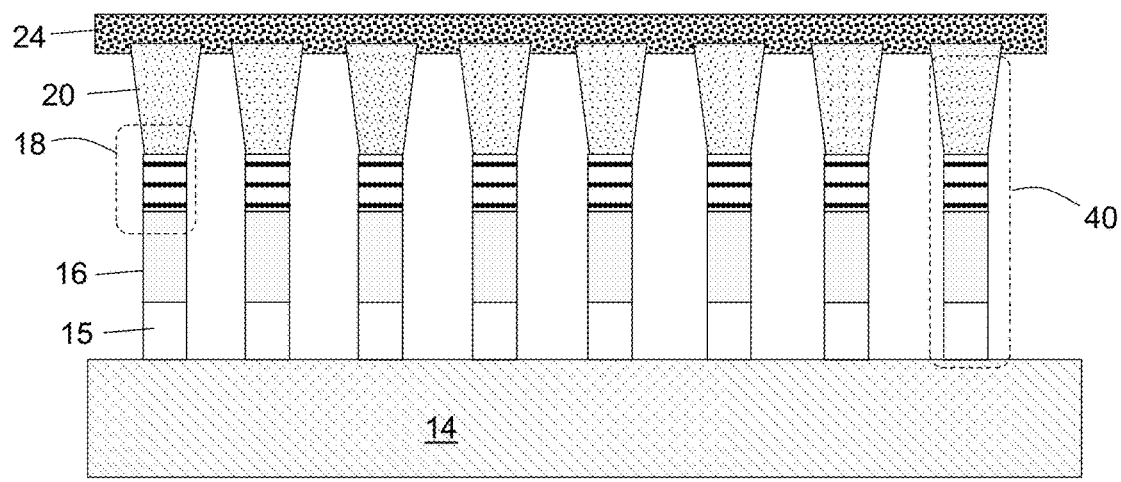
FIG. 5 shows a schematic structure of an illustrative optoelectronic device having a nanowire semiconductor layer according to an embodiment.

The embodiment illustrated in FIGS. 4A and 4B is only one possible implementation of a heterostructure described herein. To this extent, numerous variations of the heterostructure are possible in embodiments. For example, FIG. 5 illustrates a heterostructure comprising nanowires 40 that have not coalesced. Such a configuration can be technologically preferable. As shown, a p-type layer 20 can comprise a p-type semiconductor contact layer and the layer 24 can comprise a metallic ohmic contact layer deposited over the nanowires 40 to provide a contact to the p-type semiconductor layer 20. Such an ohmic contact layer 24 can comprise nickel (Ni), gold (Au), rhodium (Rh), palladium (Pd), or any other p-type metal used in fabricating ohmic p-type contacts. The metallic layer 24 can comprise a multi-layered structure with metallic sub-layers adjacent to the p-type contact layer 22 being ohmic, and at least some metallic sub-layers being reflective to the target radiation of the semiconductor heterostructure, e.g., the radiation generated in the active region 18.

Figure 6:
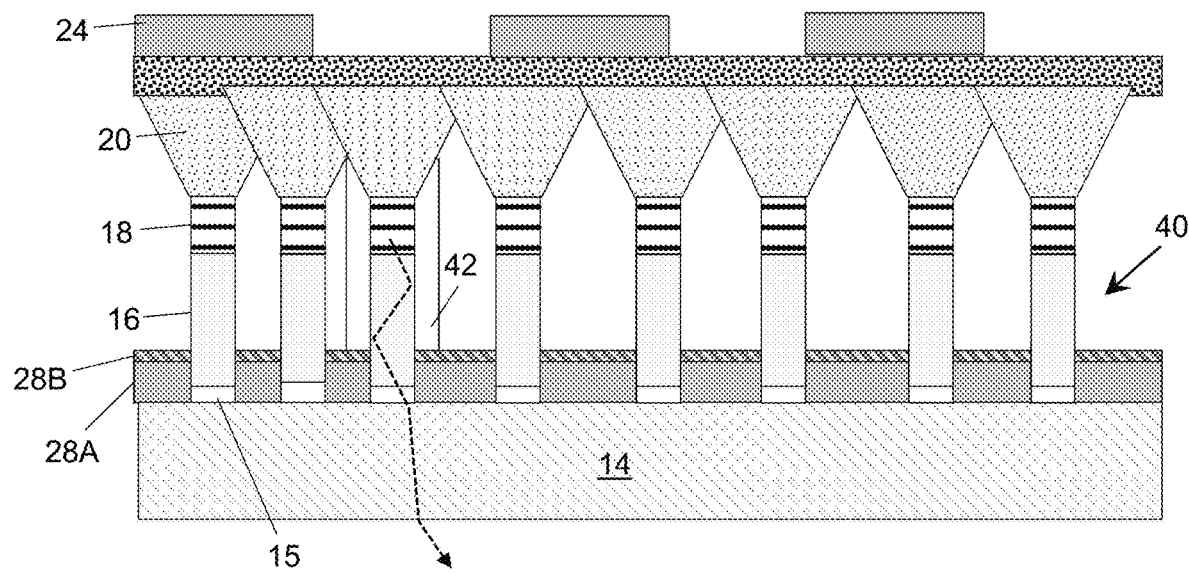
FIG. 6 shows a schematic structure of an illustrative optoelectronic device having a nanowire semiconductor layer according to another embodiment.

FIG. 6 shows an illustrative embodiment of a heterostructure having n-type and p-type metallic contacts 28A and 24 respectively. The n-type metallic contact 28A can comprise aluminum (Al), titanium (Ti), chromium (Cr), and/or a multilayered metal structure comprising Al, Ti and/or Cr deposited over a surface of a semiconductor layer 14, in the areas between the nanowires 40. The metallic contact layer 28A can be deposited to form an ohmic contact with the n-type layer 16. In addition, the n-type contact 28A can form an ohmic contact with the semiconductor layers 14, 15. In an embodiment, a reflective metallic contact layer 28B is deposited over the n-type ohmic metallic layer 28A. It is understood that the layers 28A, 28B do not need to cover an entirety of the surface of the layer 14 in the areas between nanowires 40. In particular, only part of the surface can be covered by metallic layers 28A, 28B in the proximity of the nanowires 40. While throughout the description, the columnar semiconductor structures are referred as nanowires, it is understood that embodiments of the nanowires 40 can have a characteristic radius of hundreds of nanometers and in some cases can be several microns.

In an embodiment, shown in FIG. 6, the nanowires 40 can contain passivated surfaces. For example, a passivation material 42 can be located immediately adjacent to the side surfaces of a nanowire 40. The passivation material 42 can be formed, for example, by depositing $SiO_2$, $Al_2O_3$, $Si_3N_4$, $CaF_2$, $MgF_2$, ZnO, diamond, AlZnO, and/or the like. It is understood that passivation can be used for dual purposes to increase the light extraction from the semiconductor structure for cases when the structure comprises a light emitting diode, and to eliminate electron/hole trapping states at the surface boundary of the nanowires 40. The passivation effects can be important for nanowires 40 having a small (several tens of nanometers or smaller) characteristic radius.

In FIG. 6, the layer 20 indicates that nanowires can be fabricated to have a variable diameter. The variation of diameter is not restricted to the p-type contact semiconductor region, but can be incorporated within other semiconductor layers within the nanowire 40. For example, the active region 18 can comprise a variable diameter having, for example, a smaller diameter than the diameter of other layers within the nanowire 40. In an embodiment, the active region 18 can have a continuous narrowing of the diameter (or otherwise defined as a bottleneck) towards the central portion of the active region 18. In another embodiment, the bottleneck is selected to be adjacent to the p-type layer 20 and coincide with a quantum well adjacent to p-type layer 20 (defined as the last quantum well).

Figure 7A:
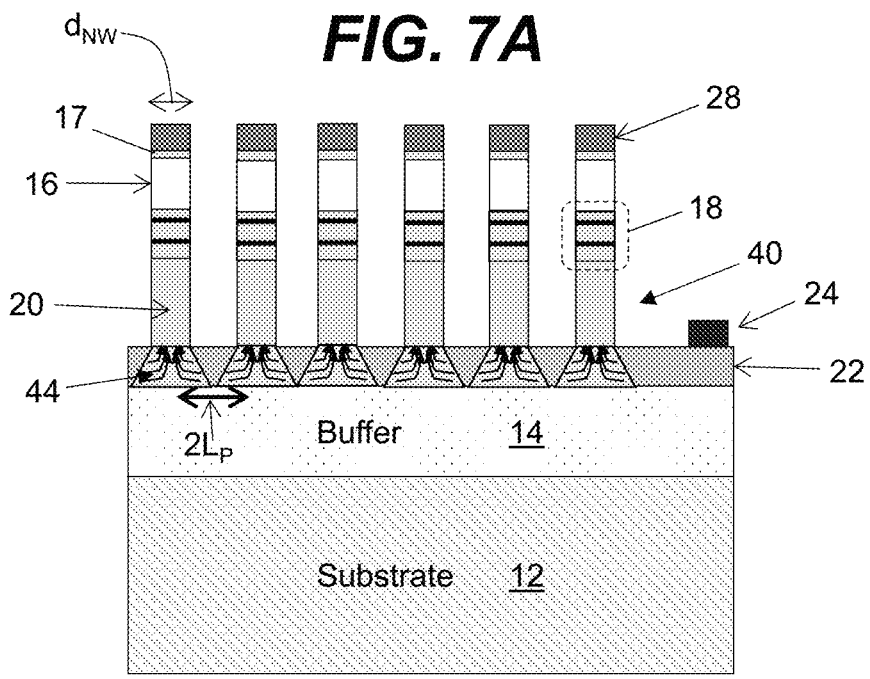
FIGS. 7A and 7B show a design and a structure of an illustrative optoelectronic device having a nanowire semiconductor layer according to an embodiment.

FIG. 7A illustrates an embodiment where the nanowires 40 are grown over a p-type contact layer 22. In an embodiment, the p-type contact layer 22 can comprise an p-type $Al_{x1}In_{y1}Ga_{1-x1-y1}N/Al_{x2}In_{y2}Ga_{1-x2-y2}N$ short period superlattice (SPSL). In an alternative embodiment, the p-type contact layer 22 comprises an $Al_xGa_{1-x}N$ with an aluminum nitride molar fraction x in the range of 0.2-0.6. The direction of deposition of the layers is reversed as compared to previous embodiments. To this extent, a p-type layer 20 can be epitaxially grown over the p-type layer 22, followed by an active region 18, followed by formation of the n-type region, which can include an n-type layer 16 and a highly n-type doped layer 17 (e.g., with the dopant concentration of at least $10^{18}$ cm-3, and preferably dopant concentration above $10^{19}$ cm$^{-3}$).

A metallic contact layer 28 can be deposited over an n-type doped layer 16, 17 and annealed to form an ohmic contact. As has been discussed, the n-type metallic contact 28 can comprise aluminum (Al), titanium (Ti), chromium (Cr) and/or multilayered metal structure comprising Al, Ti and/or Cr deposited over a surface of a nanowire semiconductor layer 16, 17.

FIG. 7A shows areas 44 from which the carriers are being collected into the nanowire active region 18. Having the nanowire diameter $d_{NW}$ and the characteristic carrier diffusion length $L_p$, the area within which the carriers will diffuse into the nanowire is given by $A_{DIF}=\pi(d_{NW}/2+L_p)^2$, whereas the area of the nanowire cross-section is given by $A_{NW}=(\pi d_{NW}^2)/4$. The holes diffused into the nanowire 40 create an effective hole concentration in the nanowire 40 which exceeds that directly under the nanowire 40 by a factor $K_p=A_{DIF}/A_{NW}=1+4(L_p/d_{NW})^2+2(L_p/d_{NW})$. The coefficient $K_p$ describes the equivalent doping increase due to hole collection by the nanowire 40. As an illustrative example, consider the following illustrative parameters: $d_{NW}$=50 nm; $L_p$=0.5 μm=500 nm. In this case, the hole concentration increases in the active region 18 of the heterostructure shown in FIG. 7A (inside the nanowire) by a factor $K_p$=421. This is quite a significant increase, hardly achievable using any known doping techniques without considerable material quality degradation.

Figure 7B:
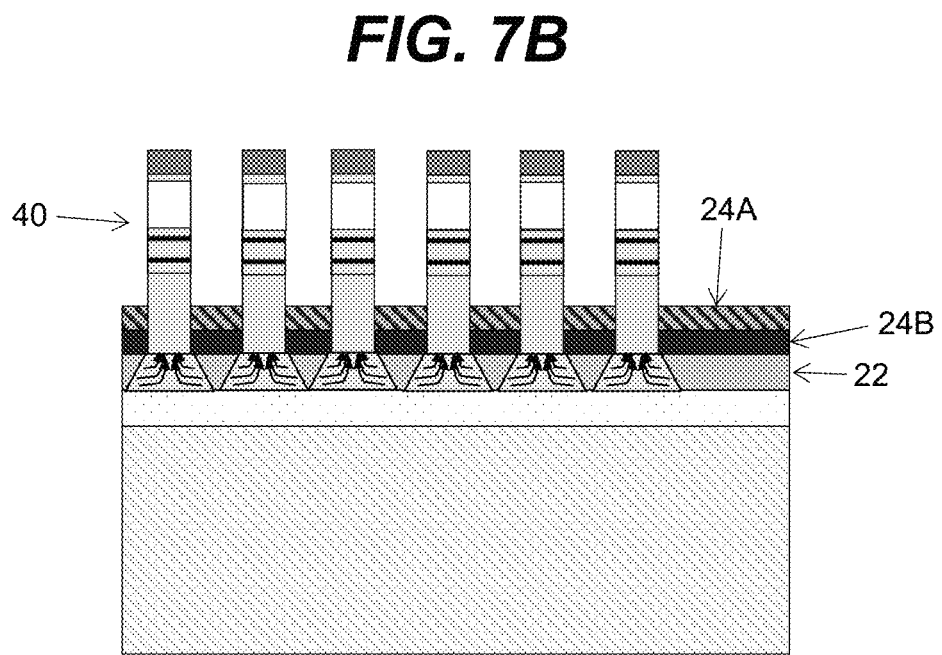

FIG. 7B illustrates a design of the device with p-type metallic contact 24B deposited between nanowires 40 over the surface of the p-type layer 22. The p-type metallic contact 24B can comprise nickel (Ni), gold (Au), rhodium (Rh), palladium (Pd), or any other p-type metal used in the fabrication of ohmic p-type contacts. The p-type metallic contact 24B can be annealed to form an ohmic contact. In an embodiment, a reflective metallic layer 24A is deposited over the ohmic contact 24B.

Figure 8A:
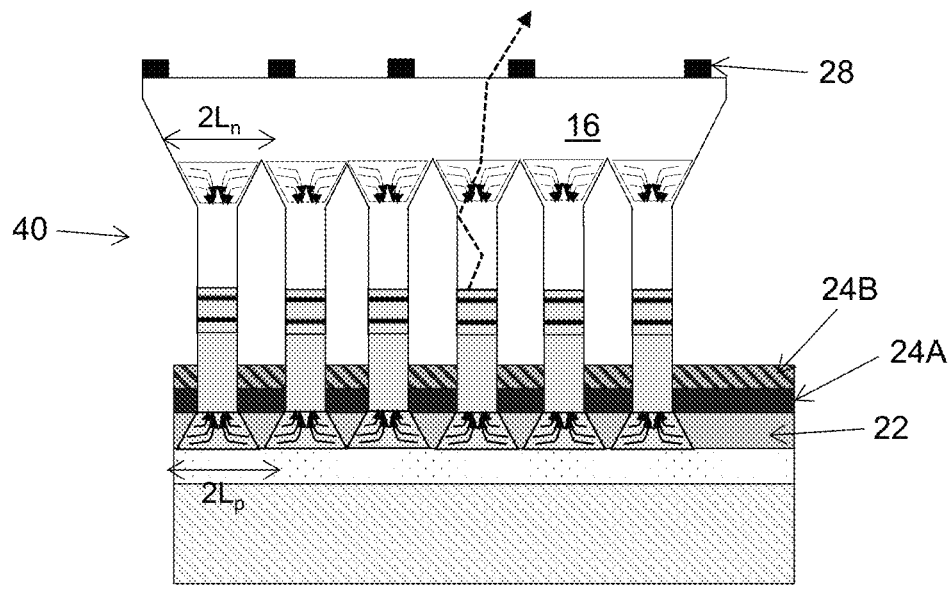
FIGS. 8A and 8B show a design and a structure of an illustrative optoelectronic device having a nanowire semiconductor layer according to an embodiment.

FIG. 8A shows another embodiment wherein the nanowires 40 are in contact with both bottom and top semiconductor layers. In this embodiment, the bottom and top layers have different doping types, e.g. the bottom layer 22 can be p-doped whereas the top layer 16 is n-doped or vice versa. The metallic ohmic contacts 24A, 28 are placed on respective surfaces of the layers 22, 16. The ohmic contact 28 can be fabricated to cover only a portion of the entire lateral surface area of the semiconductor layer 16 to allow light extraction from the uncovered regions of the surface of the semiconductor layer 16. The overall coverage of the area of the contact regions 28 can be selected to find the optimal balance between improved light extraction and diminished electronic conductivity leading to peak values of the wall plug efficiency.

Figure 8B:
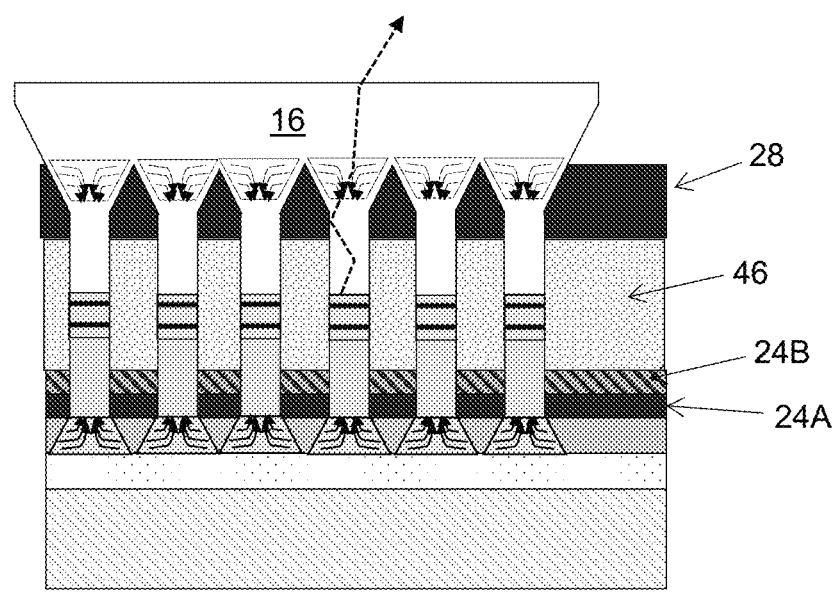

FIG. 8B shows a variation of the embodiment shown in FIG. 8A, in which the metallic contact 28 is deposited prior to finalizing the epitaxial growth. As shown, the metallic contact 28 is located between the semiconductor nanowires and has layer(s) that form an Ohmic contact with the semiconductor 16 within the nanowire structure while being electrically insulated from the active region and the contact layer 24B, 24A by an insulating layer 46. As shown in FIG. 8B, the light extraction can proceed through the top layer 16, with the top layer 16 possibly comprising a n-type UV transparent semiconductor structure. In addition, the light extraction can proceed from the sides of the nanowires through the insulating layer 46 that can be selected to be transparent to radiation generated in the active region. For example, the insulating layer 46 can be selected to be $SiO_2$, $Al_2O_3$, $CaF_2$, $MgF_2$, and/or the like.

While in embodiments discussed herein the active layer within the nanowires comprises quantum wells and barriers, it is understood that for sufficiently thin nanowires (less than 10 nanometers in diameter), the localization of carriers can be achieved without fabrication of quantum wells and barriers. In an embodiment, the further localization can be achieved by reducing the diameter of the nanowire within the recombination region.

Figure 9A:
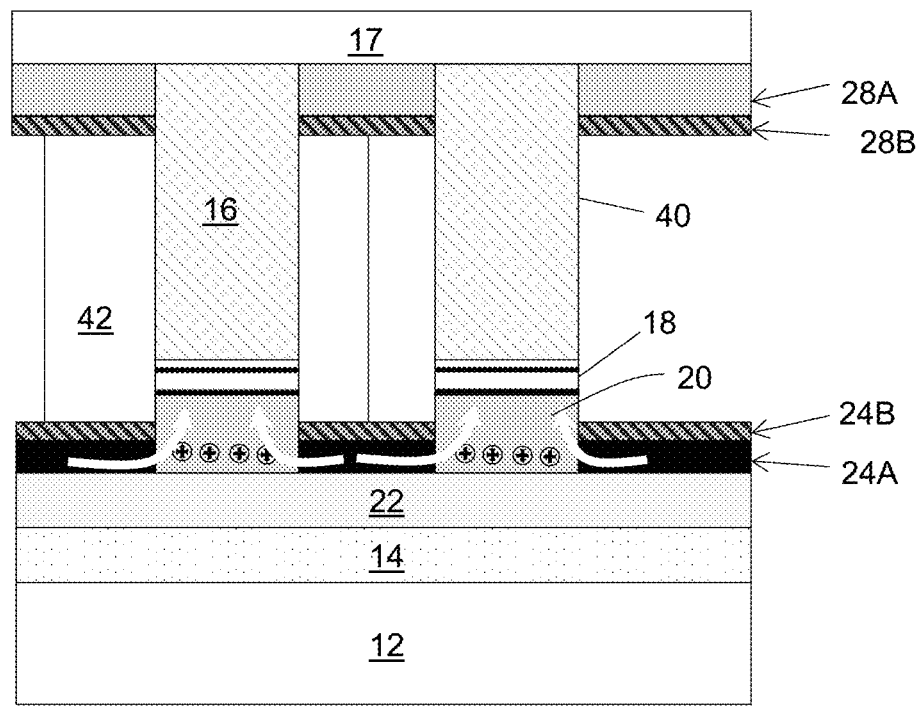
FIGS. 9A and 9B show a structure of an illustrative optoelectronic device with polarization doping according to an embodiment.
Figure 9B:
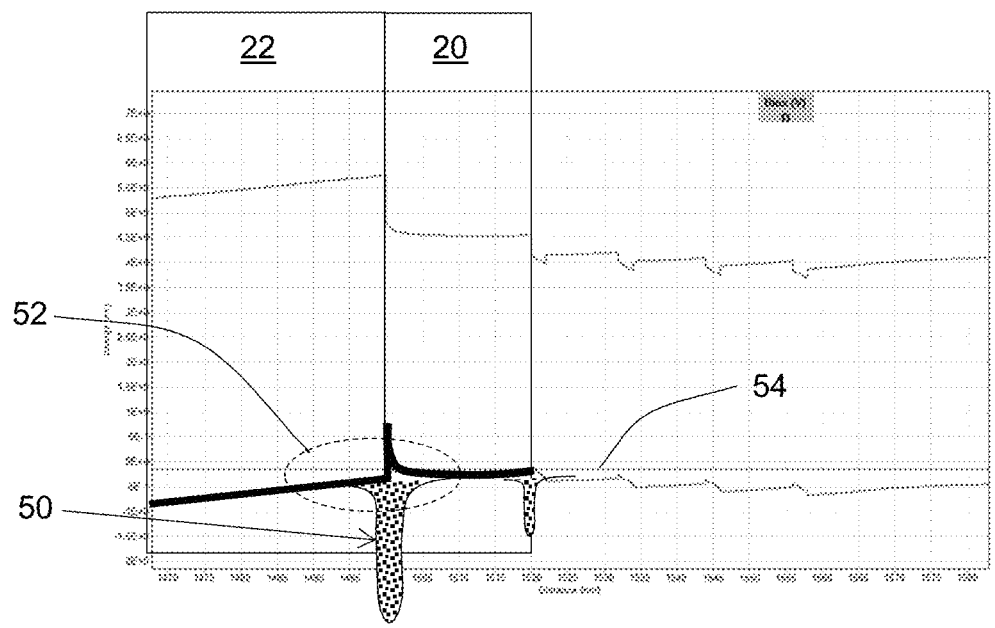

FIGS. 9A and 9B show another embodiment in which the doping of layer 20 is further increased due to polarization doping effect. Such an effect can be, for example, achieved in Ga-face AlGaN heterostructures having a bi-layer structure with the top layer of the bi-layer having lower Aluminum Nitride molar fraction compared to the bottom layer. The effective p-doping can be further increased using multiple pairs of the AlGaN layers with different Al compositions. To highlight the use of polarization doping, consider the structure in FIG. 9A that comprises a target radiation transparent substrate 12 such as sapphire, a buffer layer 14 that can comprise an AlN semiconductor layer, and a semiconductor layer 22 epitaxially grown over a buffer layer comprising, for instance, $Al_xIn_yGa_{1-x-y}N$ with molar fraction 0≤x≤1, 0≤1−x−y≤1. In general, the composition of layers 20, 22 can be selected to result in polarization doping, and in a more specific embodiment, in p-type polarization doping. For example, the layer 22 can comprise $Al_{x1}In_{y1}Ga_{1-x1-y1}N$ and the layer 20 can comprise $Al_{x2}In_{y2}Ga_{1-x2-y2}N$, such that the bandgap of the layer 20 is smaller than the bandgap of the layer 22. In an embodiment, x1>x2, and y1=y2=0.

FIG. 9B shows a band diagram, accounting for spontaneous and piezoelectric polarization, with high concentration of holes 50 resulting from polarization induced doping. The high concentration of holes 50 can be seen by valence band bending 52 and proximity of p-Fermi level 54. Such a high concentration of holes can be used to improve the conductivity of the semiconductor layer 20 even for layers with a moderately high aluminum nitride molar fraction. For example, the aluminum nitride molar fraction of the layer 20 can range between 0.2-0.6, and an aluminum nitride molar fraction of the semiconductor layer 22 can be higher than that of the layer 20 by at least 10%. In an embodiment, the aluminum nitride molar fractions of the layers 20, 22 are selected to result in polarization induced doping of at least $10^{18}$ 1/cm$^3$. In an embodiment, both layers 20, 22 are highly transparent or transparent to target radiation (e.g., radiation generated in the active region). In an embodiment, the target radiation is between 220-360 nm.

FIG. 9A shows that an energy barrier is formed between the left and right sides of the layer 20 (see the box indicating such a domain in FIG. 9B) due to band bending. The compositions of layer 20, 22 can be selected to result in the energy barrier being sufficiently low to allow holes conduction into an active region 18. Furthermore, the thickness of the layer 20 can be selected to not exceed the diffusion length of the holes within the layer 20, thus the thickness can be chosen to be between 10-1000 nm. Parameters controlling the performance of the device, including the thickness of the layers 20, 22, the molar fraction of aluminum nitride in the layers 20, 22 and the molar fraction of barriers and wells in active region 18 can be optimized using numerical simulation. In order for the layer 20 to draw in the holes induced by the polarization field, the layer 20 is contacted by an ohmic metallic contact 24A. A light reflective layer 24B can be used to provide improved light extraction. A feature of the design shown in FIG. 9A is an absence of a highly absorbing p-type semiconductor layer as well as reduced impact of absorbing p-type metallic ohmic contact layer 24A.

FIG. 9A also shows that the top portion of the nanowire 40, which includes an n-type layer 16, can be contacted by a n-type electrode, which can comprise an ohmic layer 28A and a reflective layer 28B, respectively. The top layer 17 can be chosen to be UV transparent and can comprise fused silica and/or the like. Alternatively, the top layer 17 can comprise an overgrown semiconductor n-type layer with high transparency to UV radiation. In an embodiment, an insulating transparent layer 42 can be deposited adjacent to a side surface of the nanowire 40 for passivation. The passivation can be done by depositing $SiO_2$, $Al_2O_3$, $Si_3N_4$, $CaF_2$, $MgF_2$, ZnO, diamond, AlZnO and/or the like. It is understood that passivation can be used for dual purpose to increase the light extraction from the semiconductor structure for cases when the structure comprises light emitting diode, and to eliminate electron/hole trapping states at the surface boundary of the nanowires 40.

The structures of FIG. 9A and FIG. 9B can be incorporated into an optoelectronic device which is configured to operate as a light emitting diode, photodiode, solid state light sensor, laser diode and/or the like. In each case, a feature of the embodiment comprises a first $Al_{x1}In_{y1}Ga_{1-x1-y1}N$ semiconductor layer with a molar fraction $0 \le x1 \le 1$, $0 \le 1-x1-y1 \le 1$ epitaxially grown over a buffer layer. The buffer layer can comprise an AlN layer, but can have a complex structure comprising semiconductor heterostructure layers as discussed herein. The first semiconductor layer can be n-type doped or p-type doped with dopant concentration on the order of $10^{18}$ 1/cm$^3$. The first semiconductor layer is followed by a composite nanowire semiconductor layer comprising nanowires having multiple semiconductor layers. The second semiconductor layer (being the first semiconductor sublayer within nanowire semiconductor layer) comprises $Al_{x2}In_{y2}Ga_{1-x2-y2}N$ semiconductor layer with molar fraction $0 \le x2 \le 1$, $0 \le 1-x2-y2 \le 1$, with the second semiconductor layer adjacent to the first semiconductor layer.

In an embodiment, the second semiconductor layer has a composition that is different from the first semiconductor layer. In an embodiment, the bandgap of the second semiconductor layer is smaller than the bandgap of the first semiconductor layer. In an embodiment, the bandgap of the second semiconductor layer is at least 5% smaller than the bandgap of the first semiconductor layer, and in a more particular embodiment, the bandgap of the second semiconductor layer is at least 10% smaller than the bandgap of the first layer. In an embodiment, the first semiconductor layer can comprise $Al_xGa_{1-x}N$ layer with x being in the range of 0.3-0.8, and the second semiconductor layer comprise $Al_yGa_{1-y}N$ layer with y being in the range of 0.2-0.7.

Furthermore, following the second semiconductor layer, the nanowire layer can comprise an active layer as described herein, followed by a third $Al_{x3}In_{y3}Ga_{1-x3-y3}N$ and a fourth $Al_{x4}In_{y4}Ga_{1-x4-y4}N$ semiconductor layer. In an embodiment, the third and the forth semiconductor layers can comprise sublayers within a nanowire. Furthermore, the third and fourth semiconductor layers can have different molar fractions of aluminum nitride. In an embodiment, the third semiconductor layer has a bandgap smaller than the bandgap of the fourth semiconductor layer. In an embodiment, the bandgap of the third semiconductor layer is at least 5% smaller than the bandgap of the fourth semiconductor layer, and in a more particular embodiment, the bandgap of the third semiconductor layer is at least 10% smaller than the bandgap of the fourth layer. In an embodiment, the fourth semiconductor layer can comprise $Al_xGa_{1-x}N$ layer with x being in the range of 0.3-0.8, and the third semiconductor layer comprise $Al_yGa_{1-y}N$ layer with y being in the range of 0.2-0.7.

It is understood that any combination of one or more of the four semiconductor layers can comprise a graded composition. For example, the second and the third semiconductor layer can comprise a graded composition. To this extent, the second semiconductor layer can have an aluminum nitride molar ratio that decreases with the distance from the first semiconductor layer. Using grading, the doping and electrical properties of the second semiconductor layer can be controlled and optimized. Similarly, the third semiconductor layer can have a graded composition with the aluminum nitride molar ratio decreasing with the distance from the fourth semiconductor layer. A graded composition can be combined with variations in the diameter of the nanowire. For example the diameter of the nanowire can have a minimum within an active region. Furthermore, the diameter of the nanowire can be adjusted to maintain a constant hole density throughout the active region.

In general, at least the first and at least the fourth semiconductor layers are doped to form a p-n junction. In an embodiment, the first semiconductor layer is p-type doped with a dopant concentration of at least $10^{18}$ 1/cm$^3$. For such an embodiment, the fourth semiconductor layer can be n-type doped with a dopant concentration of at least $10^{18}$ 1/cm$^3$. It is understood that an alternative embodiment can be utilized, such as where the first semiconductor layer is n-type doped while the fourth semiconductor layer is p-type doped.

Figure 10:
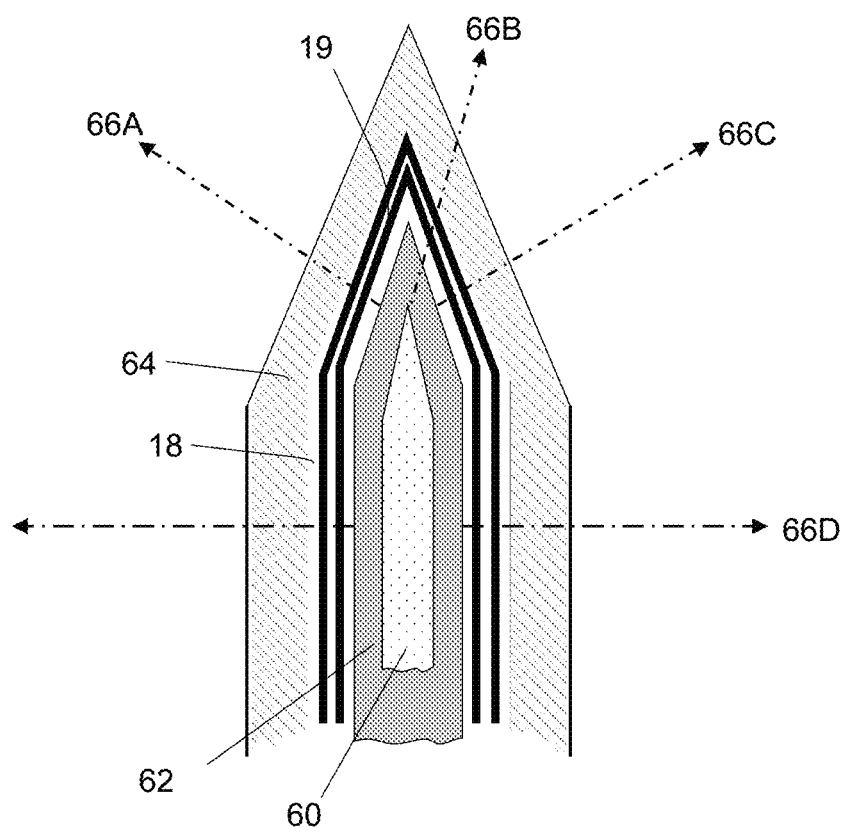
FIG. 10 shows a structure of a nanowire according to an embodiment.

The structure of a semiconductor nanowire grown using a bottom-up approach (an approach where nanowire is epitaxially grown) can be significantly different than the structure of a nanowire engineered using either template assisted growth, or etching (top down approach). FIG. 10 shows an illustrative nanowire grown using bottom-up approach, which can contain a core region 60, a first semiconductor layer 62, an active region 18 having multiple quantum wells 19, and an outer shell region 64. The outer shell region 64 can comprise a n-type semiconductor layer, the core region 60 can comprise a p-type $Al_xGa_{1-x}N$ layer, and the first semiconductor layer 62 can comprise $Al_yGa_{1-y}N$ with a molar fraction y<x to allow for polarization doping. A p-type contact can be formed by accessing a base of the nanowire with a p-type metallic contact. Access to the surface of the semiconductor layer 64 with electrically conductive material can allow for an n-type contact. A height of the nanowire can be optimized for efficient injection of holes into the active region 18. Having the outer shell region 64 as a n-type layer can improve the light extraction from the nanowire due to typical transparency of the n-type layer to the target radiation. For instance, the n-type layer 64 can comprise an $Al_xGa_{1-x}N$ layer with an aluminum nitride molar fraction in the range of 0.4-0.5 being transparent to ultraviolet radiation.

FIG. 10 illustrates a particular aspect of the nanowire embodiment wherein the active region 18 is grown laterally (along direction 66D) and/or in semi-polar planes (directions 66A-66C) to reduce polarization effects of the semiconductor layer heterojunctions. For such a combination, the polarization doping is not a preferred mechanism due to reduced polarization effects. In this case, a p-type doped semiconductor layer 62 may be preferable.

In an alternative embodiment, both the core region 60 and layer 62 can comprise n-type semiconductor layers. The core region 60 can comprise $Al_xGa_{1-x}N$, and the first semiconductor layer 62 can comprise $Al_yGa_{1-y}N$ with molar fraction y<x to allow for polarization doping. For such a configuration, the outer semiconductor layer 64 can comprise a p-type semiconductor layer.

Figure 11A:
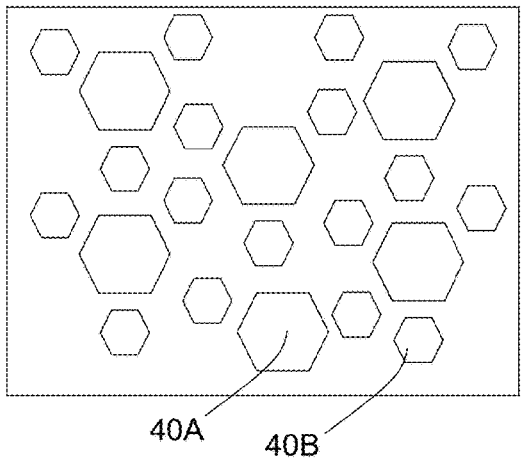
FIGS. 11A-11D show illustrative nanowire semiconductor layers with nanowires having variable diameter and/or composition according to embodiments.

FIGS. 11A-11D show embodiments of heterostructures in which the nanowires can be fabricated to have various diameters. As the bandgap of a nanowire has a pronounced dependence on the nanowire diameter, these embodiments enable the fabrication of a LED with multiple wavelength emission. To this extent, FIG. 11A shows the top view of a heterostructure with different nanowire diameters. As indicated, the nanowires 40A, 40B with different diameters can be interspersed in a random or planned matter depending on the method of growth and the application of the heterostructure. FIG. 11A shows mostly randomly interspersed nanowires 40A, 40B.

Figure 11B:
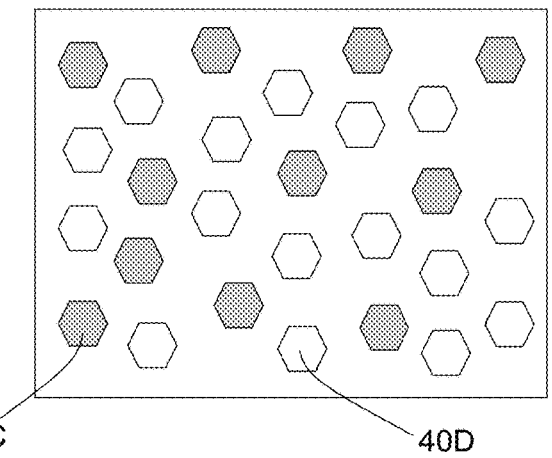

It is understood that depending on the application of the semiconductor structure there can be a set of nanowire sizes leading to a set of emission peaks from a device. It is further understood that nanowires can be positioned according to their sizes. For example, the nanowires 40B containing smaller diameter can be positioned towards the middle of the device, and be surrounded by nanowires 40B of the larger diameter. Such a configuration can lead to increased photon recycling as the higher energy photons (smaller diameter nanowires) will be absorbed and reemitted by nanowires with larger diameter. FIG. 11B shows another embodiment where the nanowires 40C, 40D can have a variable composition. For example, at least the active regions of the nanowires 40C, 40D can have a variable composition. In particular, at least some layers within active region of different nanowires 40C, 40D can have different aluminum nitride molar ratios.

Figure 11C:
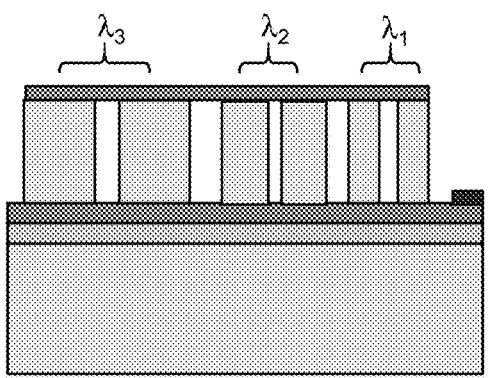
Figure 11D:
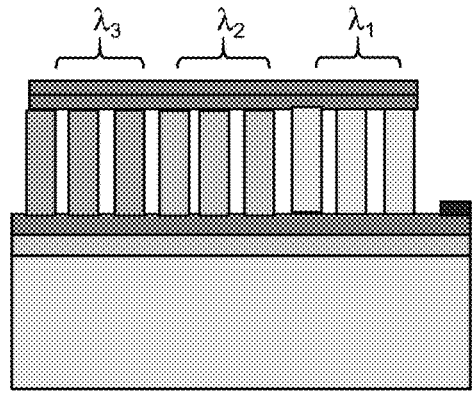

It is understood, that since the hole diffusion length depends on the material as well as material properties (such as a density of dislocations present in semiconductor layer, which in turn can depend on diameter of the nanowire) of the nanowires, the relative distance between the nanowires can be adjusted for nanowires of different composition and/or diameters. FIG. 11C shows one possible arrangement of nanowires having different diameters emitting at multiple wavelengths $\lambda_1$, $\lambda_2$ and $\lambda_3$, whereas FIG. 11D shows a possible arrangement of nanowires having different composition emitting at multiple wavelengths $\lambda_1$, $\lambda_2$ and $\lambda_3$.

Figure 12A:
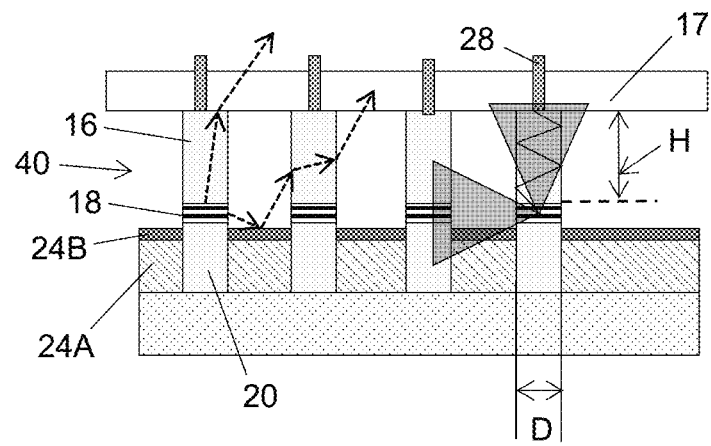
FIGS. 12A-12C show embodiments of semiconductor structure for improved light extraction.
Figure 12B:
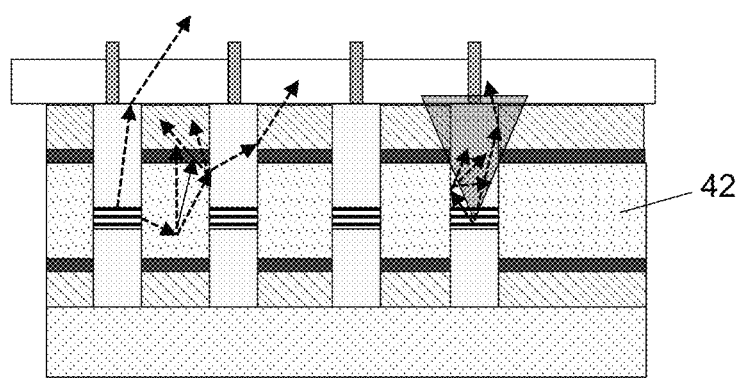
Figure 12C:
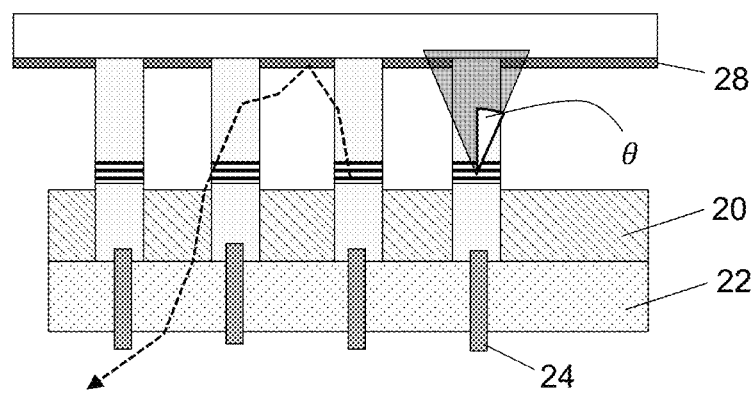

FIGS. 12A-12C illustrate various embodiments of a semiconductor heterostructure that allows improved light extraction. For example, FIG. 12A shows a semiconductor structure with a nanowire diameter and height selected to improve overall light extraction. To this extent, the cross sectional area of a nanowire D can be selected to be smaller than the area of the light extraction cone directed towards the top section of the nanowire measured a distance H from the active region 18. Such nanowire design ensures that all the rays directed towards the top portion of the nanowire are within the light extraction cone, thus such rays will be emitted and not undergo total internal reflection (TIR).

FIG. 12A shows a reflective layer 24B that is used to direct the light rays towards a UV transparent layer 17. In an embodiment, a metal ohmic contact 28 comprises n-type metallic electrodes. In this case, the nanowire 40 can include a n-type contact layer 16, an active region 18, and a p-type contact layer 20. The p-type contact layer 20 can be attached to an ohmic p-type metallic contact 24A. Considering that the TIR angle between layer 16 and layer 17 is θ, as shown in FIG. 12C, the relation between the distance H and the diameter D is given by: $\tan(\theta)=D/(2H)$.

FIG. 12B considers an embodiment, in which dielectric material 42 is deposited between the nanowires to promote light extraction. Such material can comprise $SiO_2$, $Al_2O_3$, $CaF_2$, $MgF_2$, and/or the like. In addition, the material can comprise pores and light scattering centers as shown. FIG. 12C illustrates an embodiment incorporating a reflective metallic layer 28 to target radiation, as well as transparent layers 20, 22, and metallic ohmic contact domains 24.

Figure 13A:
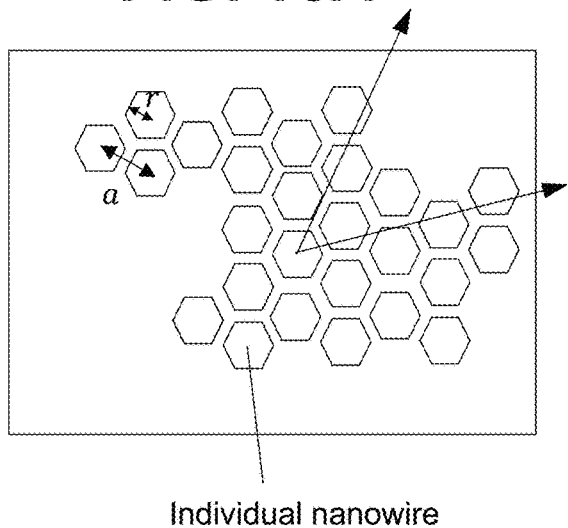
FIGS. 13A-13C show possible lateral arrangements of nanowires according to embodiments.
Figure 13B:
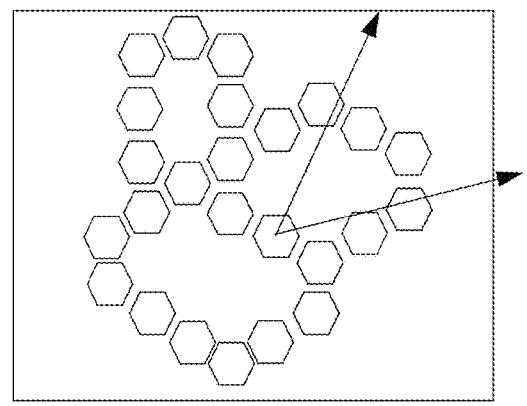
Figure 13C:
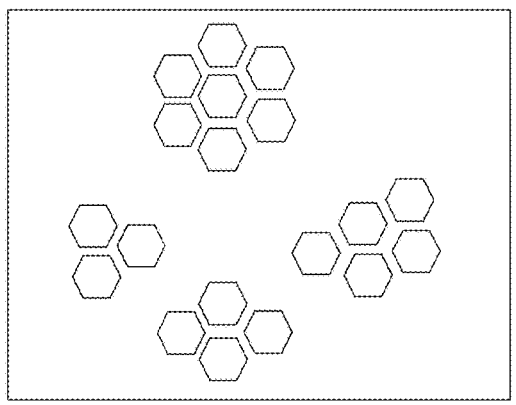

FIGS. 13A-13C illustrate an embodiment of a heterostructure in which nanowires are laterally arranged to enable light emitted from a side surface of each nanowire to exit the semiconductor structure for light rays emitted at a normal incidence to the side surfaces of the semiconductor nanowires. Considering that a nanowire absorption index can be given by $\alpha_{nanowire}$, and assuming no significant absorption between the nanowires, absorption of light in a region of multiple nanowires can be estimated as:

$$I(L) < I_0 \exp\left(-\alpha_{nanowire}\left(\frac{d}{a}\right)l\right),$$

wherein < is used to roughly take into account reflection from ambient/nanowire interface or to account for a wave nature of the emitted light. Here, α—distance between nanowire centers and d—is a diameter of a nanowire. Assuming we want at most a log reduction:

$$\frac{I(L)}{I_0} \geq 0.1$$

we have:

$$\left(\frac{d}{a}\right)L < -\frac{\ln(0.1)}{\alpha} \sim 2.3/\alpha.$$

For example, if the diameter of a nanowire is 100 nm, and the separation distance 100 nm then we do not want the lateral radius of the device to be larger than $2.3/\alpha$. More particularly, for an $Al_{0.5}Ga_{0.5}N$ semiconductor layer, and for a target radiation of about 280 nm, the absorption coefficient is $$\alpha \sim 1000 \frac{1}{cm} \rightarrow L < 23 \ \mu m.$$

The above calculation is only relevant to densely packed nanowires as shown in FIG. 13A. An alternative arrangement of nanowires can include an arrangement in a loosely packed structure as shown in FIG. 13B or in a structures comprising small densely packed islands of nanowires as shown in FIG. 13C. With an appropriate arrangement of nanowires, the design of the optoelectronic device can ensure that each nanowire can emit at least 10% of its light into the ambient surrounding the device without being absorbed by other nanowires or contacts to nanowires.

In an embodiment, the nanowires can be fabricated to form a photonic crystal having characteristic photonic lattice constants. In addition, the fabricated photonic crystal can contain waveguide regions, where waveguide regions can comprise domains having nanowires of different sizes or coalescent nanowires or connected semiconductor domains. In another embodiment, at least two sets of nanowires, with a first set of nanowires emitting or absorbing the first target wavelength of radiation and a second set of nanowires emitting or absorbing the second target wavelength of radiation, can be both fabricated in a heterostructure. As one possibility, at least one set of nanowires can form a photonic crystal. As an alternative possibility, both types of nanowires can be combined to form a photonic crystal.

As has been discussed herein, both top down and bottom up approaches are possible for fabricating a semiconductor heterostructure comprising a semiconductor nanowire layer. In an embodiment, considering the structures shown in FIGS. 12A and 12B, such structures can be fabricated by a bottom up approach. In this case, such an approach can include epitaxially growing a first semiconductor buffer layer over a substrate; growing a buffer semiconductor layer having a first type doping, and fabricating a mask over the buffer semiconductor layer having a set of openings (unmasked regions) for subsequent growth of the nanostructures. Subsequently, the nanostructures can be grown in the openings, which can include growing a first semiconductor layer having the first type doping; growing an active layer comprising quantum wells alternating with barrier layers; growing a second semiconductor layer having second type doping; overgrowing the second semiconductor layer with a third semiconductor layer until coalescence of the nanowires. Additionally, the process can include growing a fourth semiconductor layer with the second type doping.

Furthermore, the fabricated mask can be designed such that the spacing between the nanowires approximately equals twice a diffusion length of the majority carriers in the underlying semiconductor structure, where the diffusion length corresponds to the majority carriers having the smallest diffusion length. In an embodiment, the first type doping can comprise n-type doping, and the second type can comprise p-type doping. It is understood that an alternative variation is possible where the first type doping is p-type and the second type doping is n-type.

In an embodiment, prior to growing the first semiconductor layer having the first type of doping, a metallic contact film is deposited over the masking region, where the metallic contact film can comprise an electrically conductive film comprising, as an example, a first ohmic metallic contact layer deposited over the masking region, a second reflective layer deposited over the ohmic contact layer, and a first protective layer deposited over the reflective region. The protective layer can comprise an insulator, and the ohmic, reflective, and protective layers can have melting points higher than the MOCVD growth temperatures for the nanowires to avoid chamber contamination and layer decomposition. It is understood that other embodiments can include only the ohmic metallic contact layer, or the metallic contact layer with only one of the reflective or protective layers.

In addition, a variation of the fabrication processes described herein can include extending a protective insulating layer, deposited over the metallic contact, above the active region of the nanowire and above some of the region of the second semiconductor layer. Subsequently, a second metallic contact layer can be formed over the insulating layer and comprise an ohmic contact to the second semiconductor layer having second type doping. It is understood that similar to the structure of the first metallic contact layer, the second metallic contact layer can comprise multiple metallic layers, for example, with the layer directly adjacent to the semiconductor layer being ohmic, and the metallic layer directly adjacent to the insulating layer being reflective.

Figure 14A:
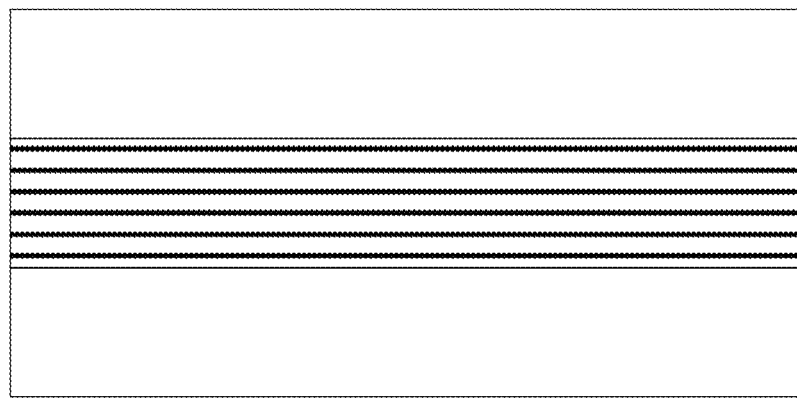
FIGS. 14A and 14B show an illustrative process for fabricating a structure according to an embodiment.
Figure 14B:
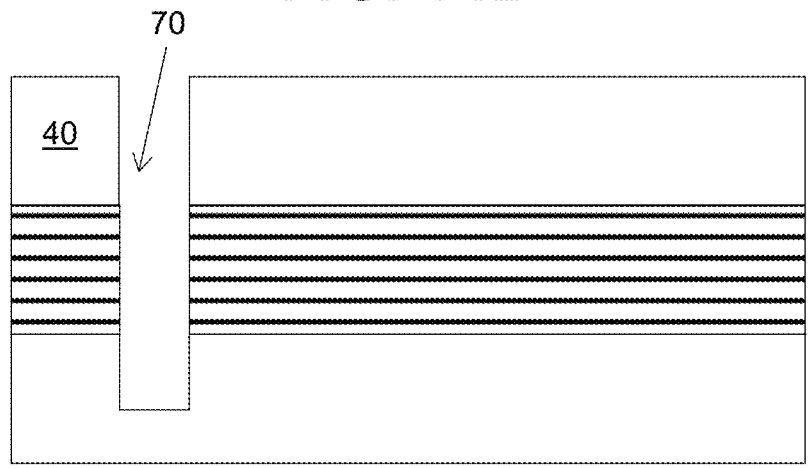

It is understood that the method outlined herein for forming nanowires using a bottom up approach can have numerous variations. For example, in an alternative embodiment, a semiconductor nanowire can be fabricated using a three dimensional growth technique. In yet another alternative embodiment, the nanowires can be fabricated through a top down approach illustrated in FIGS. 14A and 14B. In this case, the nanowires are fabricated by etching a semiconductor heterostructure comprising multiple semiconductor layers. For example, FIG. 14A shows epitaxially grown semiconductor planar layers, and FIG. 14B shows a semiconductor domain with an etched region 70, thereby forming a nanowire 40. For fabrication of nanowires using a top-down approach, the photolithography can be employed to define the nanowire pattern. The pattern can comprise a periodic or a periodic structure, with a periodic structure formed by use of interference lithography, for example.

While certain features may be shown and described in conjunction with only one or some of the heterostructure and/or device configurations included herein, it is understood that a heterostructure described herein can include any combination of the various features described herein. To this extent, the various drawings do not show mutually exclusive features which cannot be combined to form heterostructures or devices not explicitly shown in the drawings.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 15:
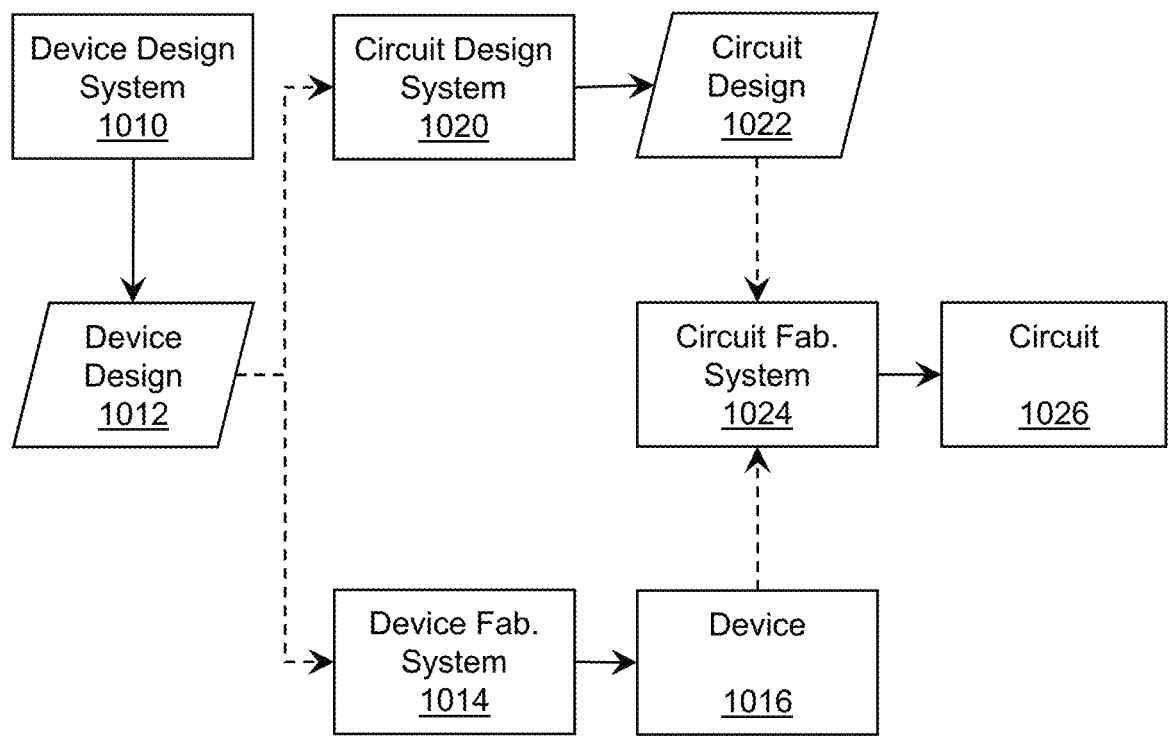
FIG. 15 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 15 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An optoelectronic device comprising:
   a contiguous first semiconductor layer;
   a nanowire semiconductor layer comprising a plurality of semiconductor nanowires located directly adjacent to the contiguous first semiconductor layer, wherein each semiconductor nanowire in the plurality of nanowires includes:
      a stress relieving layer located directly adjacent to the contiguous first semiconductor layer, the stress relieving layer comprising a heterostructure including at least one property for reducing stress; and
      an active region located on an opposite side of the stress relieving layer as the contiguous first semiconductor layer, with the active region including semiconductor quantum wells and barriers;
   a contiguous first p-type semiconductor layer located directly adjacent to an opposite side of the nanowire semiconductor layer as the contiguous first semiconductor layer, wherein the contiguous first p-type semiconductor layer comprises a short period superlattice, and wherein diameters of the plurality of semiconductor nanowires are monotonically increased in a proximity of the contiguous first p-type semiconductor layer until coalescence of nanowires into a single semiconductor layer; and
   an n-type metallic contact layer located directly adjacent to the contiguous first semiconductor layer and the stress relieving layer of at least some of the plurality of semiconductor nanowires.

2. The optoelectronic device of claim 1, wherein the plurality of semiconductor nanowires further include an n-type semiconductor layer located between the stress relieving layer and the active region and a second p-type contact semiconductor layer located over the active region.

3. The optoelectronic device of claim 2, wherein the n-type metallic contact is also located directly adjacent to at least a portion of the n-type semiconductor layer of at least some of the plurality of semiconductor nanowires.

4. The optoelectronic device of claim 1, wherein each semiconductor layer is formed of a group III nitride semiconductor material.

5. The optoelectronic device of claim 4, wherein the active region includes semiconductor quantum wells and barriers of variable gallium nitride molar fractions with variations in a direction of the nanowire axis.

6. The optoelectronic device of claim 4, wherein the active region includes semiconductor quantum wells and barriers of variable gallium nitride molar fractions with variations in a direction perpendicular to the nanowire axis.

7. The optoelectronic device of claim 4, wherein the contiguous first p-type semiconductor layer has a gallium nitride molar fraction of at least 0.2.

8. The optoelectronic device of claim 1, wherein at least some portion of the plurality of nanowires have a changing diameter with a minimum-to-maximum diameter ratio of 5 to 50 percent.

9. The optoelectronic device of claim 1, wherein the nanowire semiconductor layer has a characteristic distance between nanowires approximately twice a smaller of: a diffusion length of electrons in the contiguous first semiconductor layer or a diffusion length of holes in the contiguous first p-type semiconductor layer.

10. The optoelectronic device of claim 1, further comprising a buffer layer located below the contiguous first semiconductor layer, wherein the buffer layer has a nanowire semiconductor structure.

11. The optoelectronic device of claim 1, wherein the contiguous first semiconductor layer comprises an undoped buffer layer.

12. The optoelectronic device of claim 11, wherein the contiguous first semiconductor layer comprises an aluminum nitride layer.

13. The optoelectronic device of claim 1, wherein the stress relieving layer comprises at least one of: compositional superlattices, tensile and compressive layers resulting from variations in V/III ratio, semiconductor sublayers containing pores, or semiconductor inter-layers.

14. The optoelectronic device of claim 1, further comprising a reflective metal contact layer directly adjacent to the n-type metallic contact layer.

15. The optoelectronic device of claim 1, further comprising a p-type metallic contact directly adjacent to the contiguous first p-type semiconductor layer, wherein the p-type metallic contact contacts only a portion of the contiguous first p-type semiconductor layer.

16. The optoelectronic device of claim 1, further comprising a passivation material located immediately adjacent to at least one side surface of at least some of the plurality of nanowires.

17. The optoelectronic device of claim 1, wherein the plurality of semiconductor nanowires further include a second p-type contact semiconductor layer, and wherein the active region comprises a smaller diameter than the second p-type contact semiconductor layer.

18. An optoelectronic device comprising:
 a contiguous first semiconductor layer;
 a nanowire semiconductor layer comprising a plurality of semiconductor nanowires located directly adjacent to the continuous first semiconductor layer, wherein each semiconductor nanowire in the plurality of nanowires includes:
  a stress relieving layer located directly adjacent to the continuous first semiconductor layer, the stress relieving layer comprising a heterostructure including at least one property for reducing stress; and
  an n-type semiconductor layer located on an opposite side of the stress relieving layer as the continuous first semiconductor layer; and
  an active region located on an opposite side of the n-type semiconductor layer as the stress relieving layer, with the active region including semiconductor quantum wells and barriers;
 a contiguous first p-type semiconductor layer located directly adjacent to an opposite side of the nanowire semiconductor layer as the continuous first semiconductor layer, wherein the continuous first p-type semiconductor layer comprises a short period superlattice, and wherein diameters of the plurality of semiconductor nanowires are monotonically increased in a proximity of the continuous first p-type semiconductor layer until coalescence of nanowires into a single semiconductor layer; and
 an n-type metallic contact located directly adjacent to the contiguous first semiconductor layer and the stress relieving layer and at least a portion of the n-type semiconductor layer of at least some of the plurality of semiconductor nanowires.

* * * * *